United States Patent
Christenson et al.

(10) Patent No.: US 12,089,359 B2
(45) Date of Patent: Sep. 10, 2024

(54) ISOLATED COMPONENT MOUNTING SCHEME

(71) Applicant: International Business Machines Corporation, Armonk, NY (US)

(72) Inventors: Brandon R. Christenson, Rochester, MN (US); Phillip V. Mann, Rochester, MN (US); Christopher Lee Tuma, Mantorville, MN (US); George Russell Zettles, IV, Rochester, MN (US); Matthew A. Walther, Rochester, MN (US); Ray Clement Laning, Paynesville, MN (US)

(73) Assignee: International Business Machines Corporation, Armonk, NY (US)

( * ) Notice: Subject to any disclaimer, the term of this patent is extended or adjusted under 35 U.S.C. 154(b) by 489 days.

(21) Appl. No.: 17/483,789

(22) Filed: Sep. 23, 2021

(65) Prior Publication Data

US 2023/0088168 A1 Mar. 23, 2023

(51) Int. Cl.
*H05K 7/14* (2006.01)

(52) U.S. Cl.
CPC ......... *H05K 7/1457* (2013.01); *H05K 7/1452* (2013.01)

(58) Field of Classification Search
CPC ............................ H05K 7/1457; H05K 7/1452
USPC ......................................................... 361/796
See application file for complete search history.

(56) References Cited

U.S. PATENT DOCUMENTS

| | | | |
|---|---|---|---|
| 3,356,902 A | 12/1967 | Blaikie | |
| 6,560,124 B1 | 5/2003 | Irie | |
| 7,656,657 B2 | 2/2010 | Grady | |
| 8,040,679 B2 | 10/2011 | Yeo | |
| 9,618,688 B2 | 4/2017 | Choi | |
| 11,177,618 B1* | 11/2021 | Tunks | H05K 7/1492 |
| 2002/0166020 A1* | 11/2002 | Irving | G06F 13/409 |
| | | | 710/301 |
| 2013/0235524 A1* | 9/2013 | Baba | H05K 7/20136 |
| | | | 361/695 |
| 2015/0181757 A1* | 6/2015 | Wright | H01R 13/68 |
| | | | 439/701 |
| 2016/0328577 A1* | 11/2016 | Howley | G16H 20/60 |
| 2022/0087045 A1* | 3/2022 | Jorge | H05K 7/1445 |

FOREIGN PATENT DOCUMENTS

| | | |
|---|---|---|
| CN | 109521228 A | 3/2019 |
| KR | 20050104553 A | 11/2005 |

* cited by examiner

*Primary Examiner* — Zhengfu J Feng
(74) *Attorney, Agent, or Firm* — Stosch Sabo

(57) ABSTRACT

An electronic component system includes a chassis that includes a body, an electrically isolated portion, and an insulator disposed between the electrically isolated portion and the body, wherein the insulator is comprised of a first electrically insulating material. The electronic component system further includes a first electronic component mounted to the electrically isolated portion, and a second electronic component mounted to the body and electrically connected to the first electronic component.

19 Claims, 6 Drawing Sheets

ISOLATED COMPONENT MOUNTING SCHEME

BACKGROUND

The present disclosure relates to electronic component mounting, and more specifically, to electronic component mounting with electrical isolation features.

Computing systems can include hardware signal chains between separate computers, such as, for example, signal and/or power cables. These cables can include metallic conductors that are interspersed with electronic components. These electronic components can be connected to other electronic components, for example, for power, control, and/or monitoring. However, the electronic components disposed in the hardware signal chains can have a reference ground that may be different from the reference ground of the power/control/monitoring electronic components. However, having two different reference grounds can negatively affect the signal integrity in the hardware signal chains.

SUMMARY

According to an embodiment of the present disclosure, an electronic component system includes a chassis that includes a body, an electrically isolated portion, and an insulator disposed between the electrically isolated portion and the body, wherein the insulator is comprised of a first electrically insulating material. The electronic component system further includes a first electronic component mounted to the electrically isolated portion, and a second electronic component mounted to the body and electrically connected to the first electronic component.

According to an embodiment of the present disclosure, a computer system includes a first computer, a second computer communicatively connected to the first computer via a plurality of hardware signal chains, a first electronic component disposed in one of the plurality of hardware signal chains, and a chassis. The chassis includes a housing that includes an electrically isolated portion and a second electronic component electrically connected to the first electronic component, and the first component is mounted to an electrically isolated portion.

DETAILED DESCRIPTION

Figure 1:
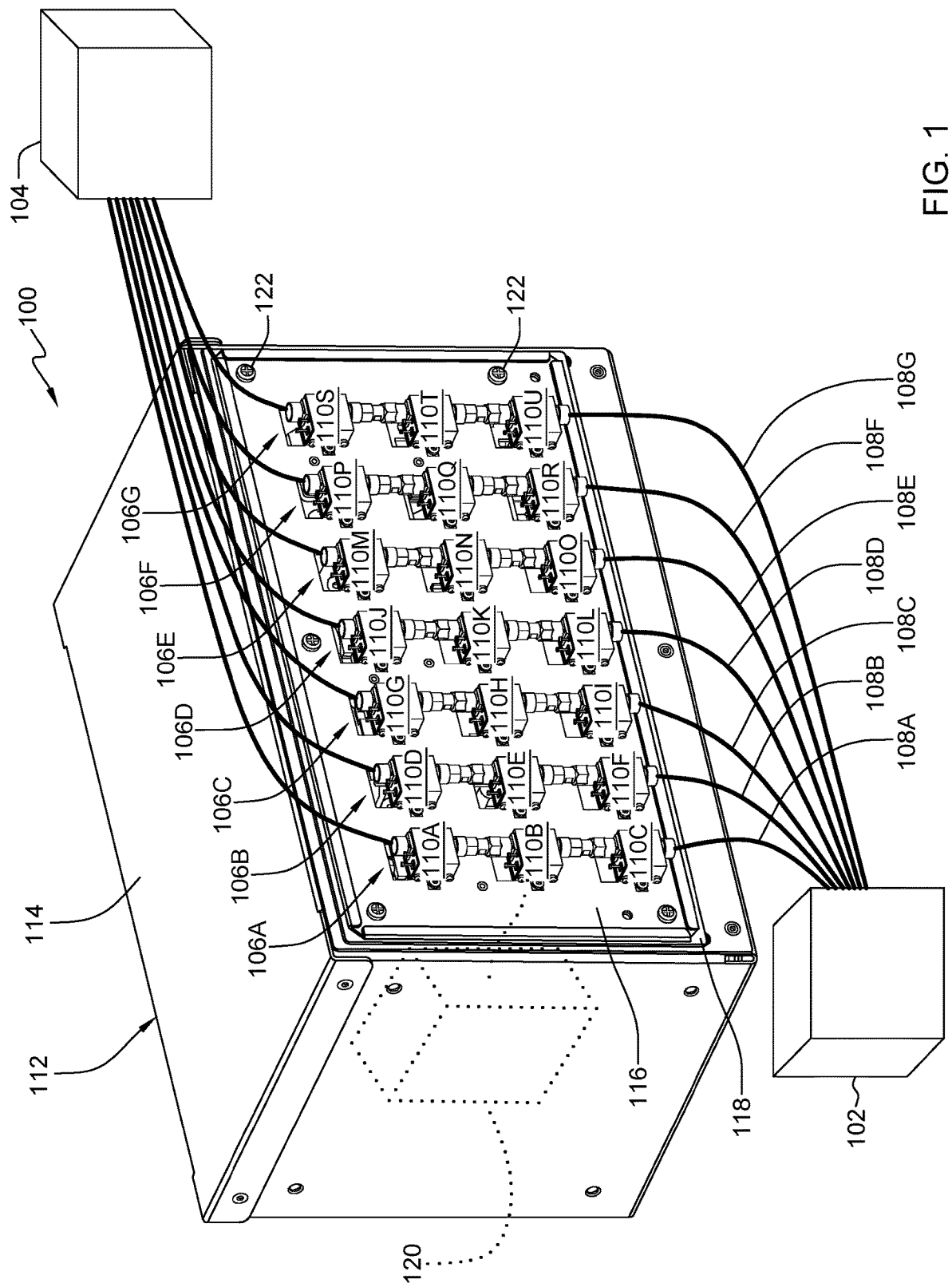
FIG. 1 is a perspective view of a computer system including a chassis, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary components at the interface of the two elements.

FIG. 1 is a perspective view of computer system 100. In the illustrated embodiment, computer system 100 is a quantum computer that comprises cryostat 102 that houses a qubit hardware computer at low temperature and comprises control computer 104 for controlling the qubit hardware computer using conventional binary hardware. Therefore, there are seven hardware signal chains 106A-106G (collectively "chains 106") that extend between cryostat 102 and control computer 104. Chains 106 comprise signal cables 108 comprised of a metallic material, such as, for example, copper, aluminum, silver, or gold. Chains 106 further comprise electronic components 110A-110U (collectively "components 110") which are connected to signal cables 108.

In the illustrated embodiment, there are twenty-one electronic components 110A-110U disposed in chains 106A-106G, respectively. Electronic components 110 assist with the signal processing between cryostat 102 and control computer 104, so each of electronic components 110 can be, for example, an amplifier, an attenuator, a directional coupler, a filter, or a splitter. Electronic components 110 are mounted to chassis 112 such that the electronic components 110 of a given chain 106 are in line with one another. Chassis 112 is a housing that comprises body 114, an electrically isolated portion such as panel 116, and insulator 118. Chassis 112 may include components that provide a structural integrity of computer system 100, and also defines surfaces to which electrical components 110 are mounted (though the term chassis 112 is not understood to include components such as fasteners, screws, standoffs, or the like, even as some aspects of chassis 112 may be assembled using some fasteners or the like). As discussed herein, the electrically isolated portion (e.g., panel 116) may be configured to "electrically float" within computer system 100 relative to other portions of chassis 112, such, e.g., that the electrically isolated portion defines a substantial exterior surface of computer system 100 even as the electrically isolated portion is electrically isolated from other portions of chassis 112 (e.g., via insulator 118). Body 114 is a box formed by bent and fastened sheet metal, and electronic component 120 is mounted inside body 114. Electronic component 120 is electrically connected to at least one of electronic components 110. As shown in FIG. 1, electronic component 120 is only connected to electronic component 110B and can provide power, control, and/or monitoring for electronic component 110B. Thereby, electronic component 120 can be, for example, a power supply or an integrated circuit.

In the illustrated embodiment, body 114 includes a port (shown in FIG. 3) extending across at least 75% of the area of one side. Panel 116 is a flat piece of sheet metal that covers this port and is fastened to body 114 with fasteners 122. Sandwiched between panel 116 and body 114 is insulator 118. While body 114 and panel 116 are comprised of electrically conductive material, insulator 118 and fasteners 122 are comprised of electrically insulative material. Thereby, panel 116 is structurally connected to body 114 but electrically isolated from the remainder of chassis 112. Because electronic components 110 are mounted to panel 116, their electrical grounds (and the electrical grounds of chains 106) can be separated from the electrical ground of body 114 and/or electronic component 120. This feature can prevent the chains 106 from being influenced/affected by different electrical grounds, which prevents the deterioration of the signal integrity therein.

Depicted in FIG. 1 is one embodiment of the present disclosure, to which there are alternative embodiments. For example, there can be fewer or greater numbers of chains 106, electronic components 110, and/or electronic components 120. For another example, there can be only one or two electronic components 110 in each chain 106. In addition, if there are two or three electronic components 110 in a given chain 106, the types of components can be the same (e.g., three serial amplifiers) or they can be different (e.g., an amplifier and then a filter), as appropriate.

Figure 2:
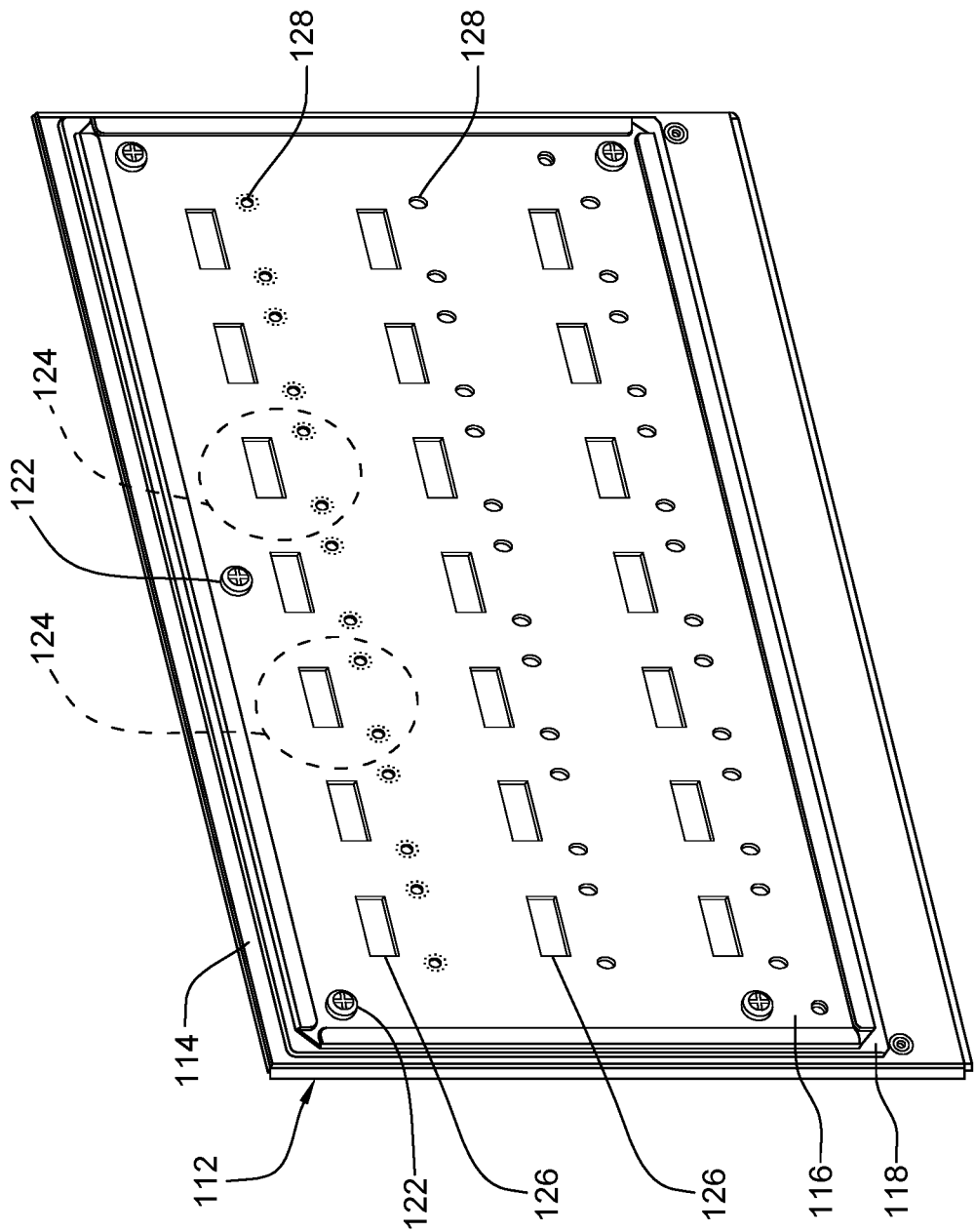
FIG. 2 is a perspective view of a side of the chassis including an insulator and an electrically isolated panel, in accordance with an embodiment of the present disclosure.

FIG. 2 is a perspective view of a side of chassis 112 including panel 116 and insulator 118. In the illustrated embodiment, panel 116 includes a regular array of mounting positions 124 for selectively connecting electronic components 110 (shown in FIG. 1) to chassis 112. Each mounting position 124 comprises port 126 and two mounting features 128. Mounting features 128 can be, for example, threaded bosses or welded-on backside nuts that allow for the structural connection of an electronic component 110 to panel 116. Port 126 can have a sufficient size and shape for a connector to pass through to allow for the electrical connection of an electronic component 110 to electronic component 120 (shown in FIG. 1).

Panel 116 is sufficiently rigid to have every mounting position 124 occupied (as is shown in FIG. 1), although not all of mounting positions 124 need to be used. Because panel 116 is an electrically isolated portion of chassis 112, mounting positions 124 do not need individual electrically isolating components to be electrically isolated from the electrical ground of body 114. As such, electronic components 110 can be connected to mounting features 128 using conventional metallic hardware (e.g., steel machine screws), which can provide good mechanical rigidity, toughness, and dimensional stability; simple assembly and installation; and low cost.

Figure 3:
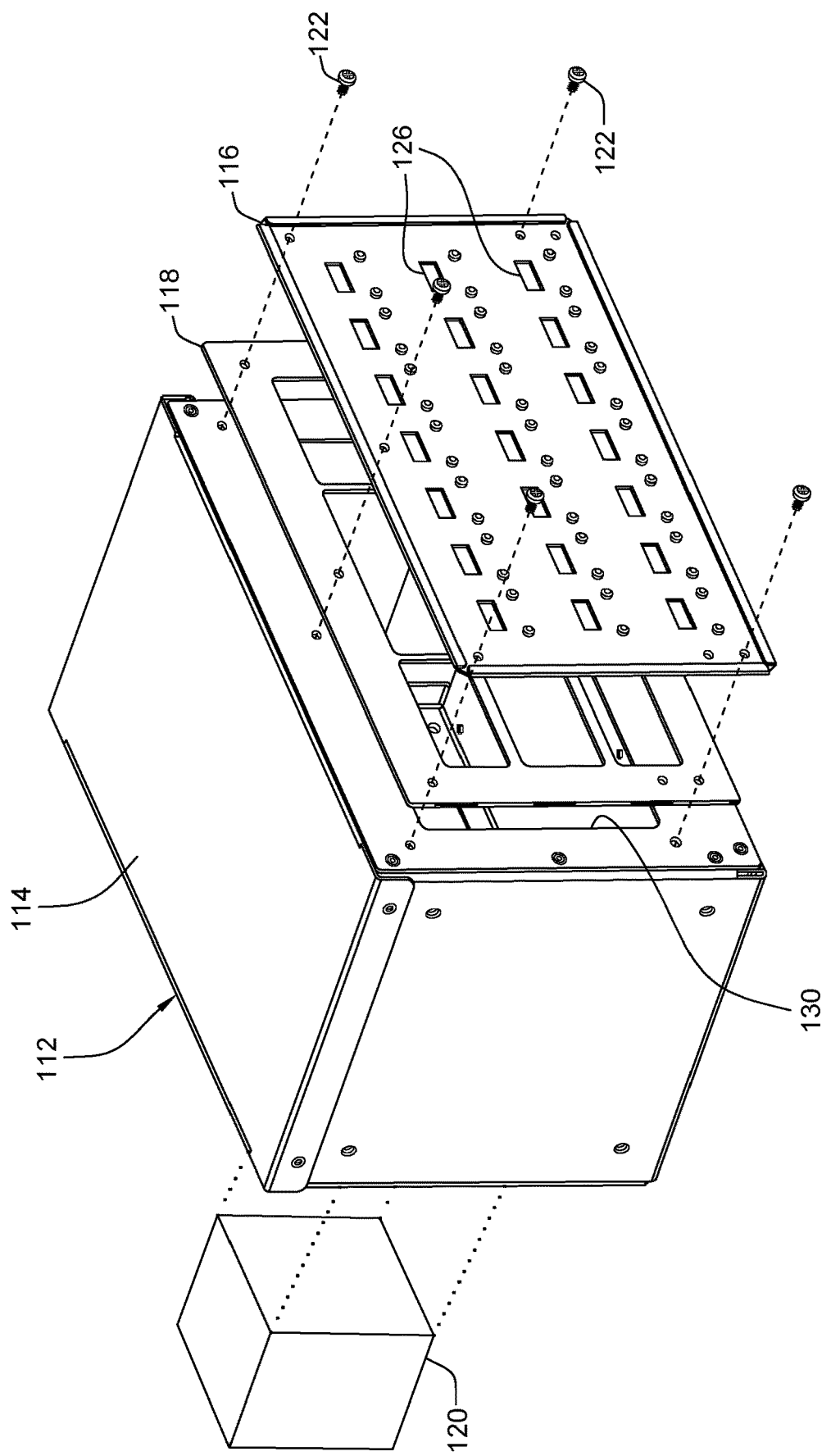
FIG. 3 is an exploded view of the chassis, in accordance with an embodiment of the present disclosure.

FIG. 3 is an exploded view of chassis 112. In the illustrated embodiment, one side of body 114 includes opening 130. Opening 130 is smaller than panel 116 but is large enough to not occlude any of ports 126. Panel 116 is smaller than insulator 118, although insulator 118 is smaller than the side of body 114 where is it connected.

In the illustrated embodiment, fasteners 122 are threaded polymer bolts (e.g., comprised of a polyamide material), although in other embodiments, fasteners 122 are clips. Because insulator 118 and fasteners 122 are comprised of electrically nonconductive materials, panel 116 is electrically separated from body 114.

Figure 4:
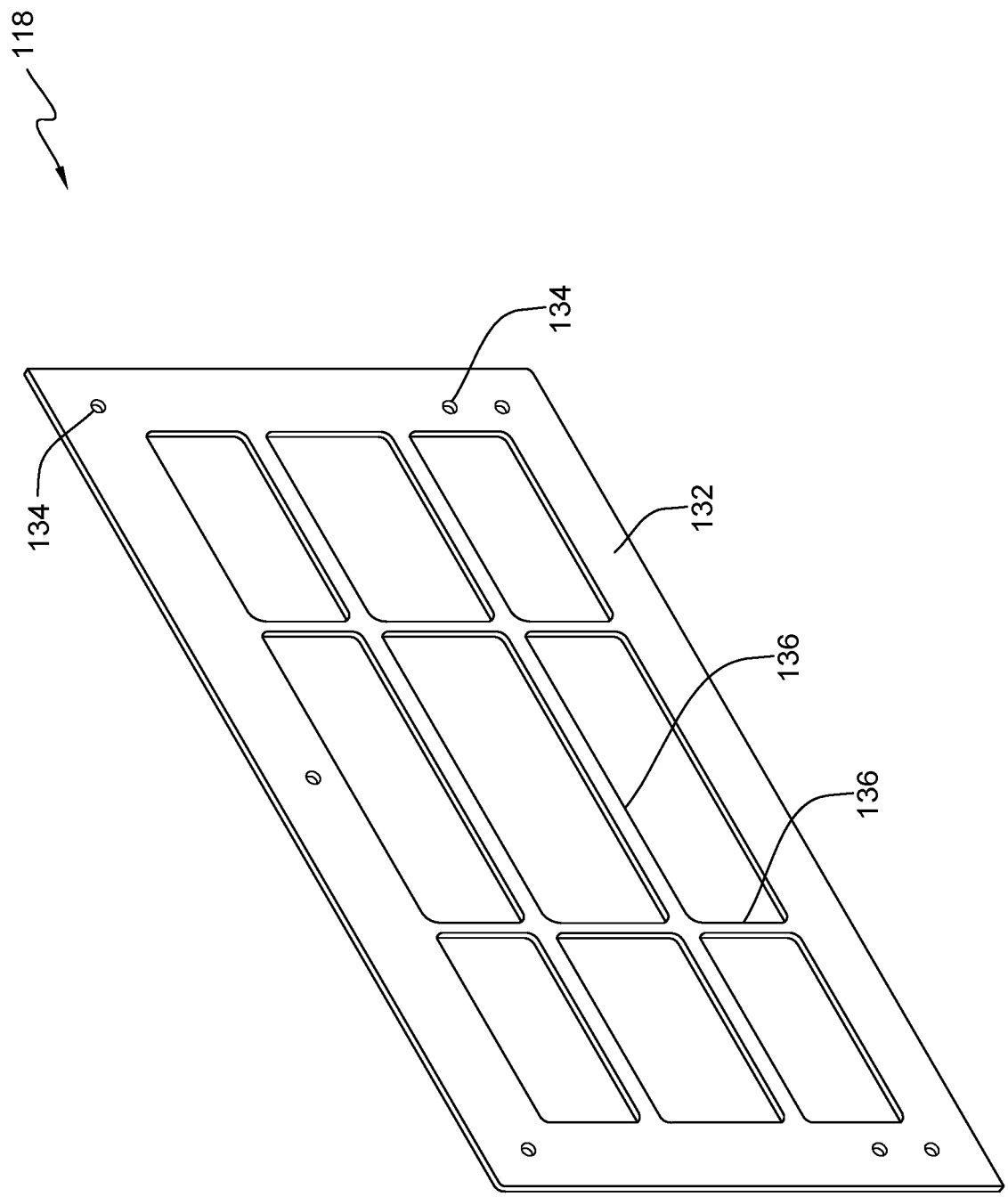
FIG. 4 is a perspective view of the insulator, in accordance with an embodiment of the present disclosure.

FIG. 4 is a perspective view of insulator 118. In the illustrated embodiment, insulator 118 is a flat sheet that is 1.5-2.0 millimeters thick of electrically nonconductive material, such as, for example, polypropylene (e.g., Formex®) or silicone. Insulator 118 includes outer rim 132 with holes 134 for mounting and cross members 136 extending across the rim at different locations. The cross members 136 are sized and positioned to not occlude any of ports 126 (shown in FIG. 3), but cross members 136 can prevent panel 116 (shown in FIG. 3) from contacting electronic component 120 (shown in FIG. 3) in case panel 116 flexes inward.

Figure 5:
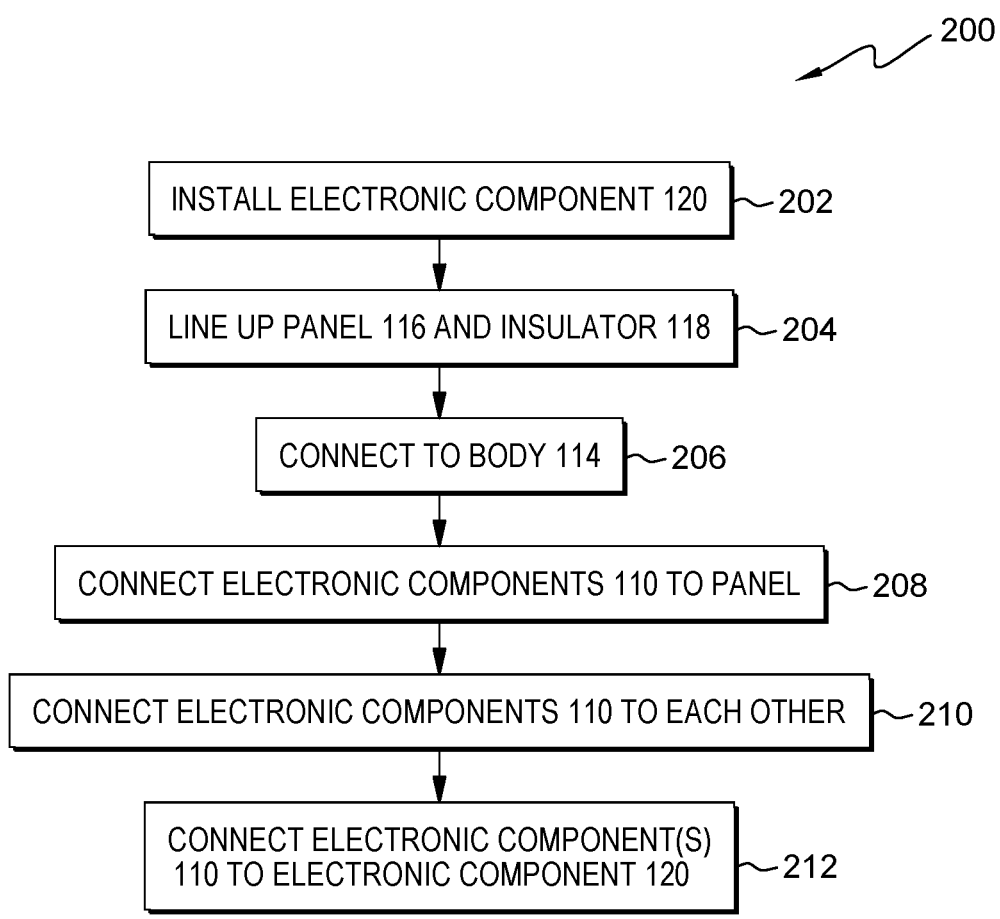
FIG. 5 is a method of assembling the computer system, in accordance with an embodiment of the present disclosure.

FIG. 5 is method 200 of assembling computer system 100. In the discussion of FIG. 5, the features of FIGS. 1-4 may be included with their respective reference numerals.

In the illustrated embodiment, at operation 202, electronic component 120 is installed in body 114. At operation 204, panel 116 and insulator 118 are lined up over the side of body 114 with opening 130. At operation 206, panel 116 and insulator 118 are connected to body 114 using fasteners 122, thus forming chassis 112. At operation 208, electronic components 110 are structurally connected to panel 116 at their respective mounting positions 124. At operation 210, electronic components 110 are connected to one another, as appropriate, to form signal chains 106. At operation 212, electronic components 110 are connected to electronic component 120, as appropriate.

Figure 6:
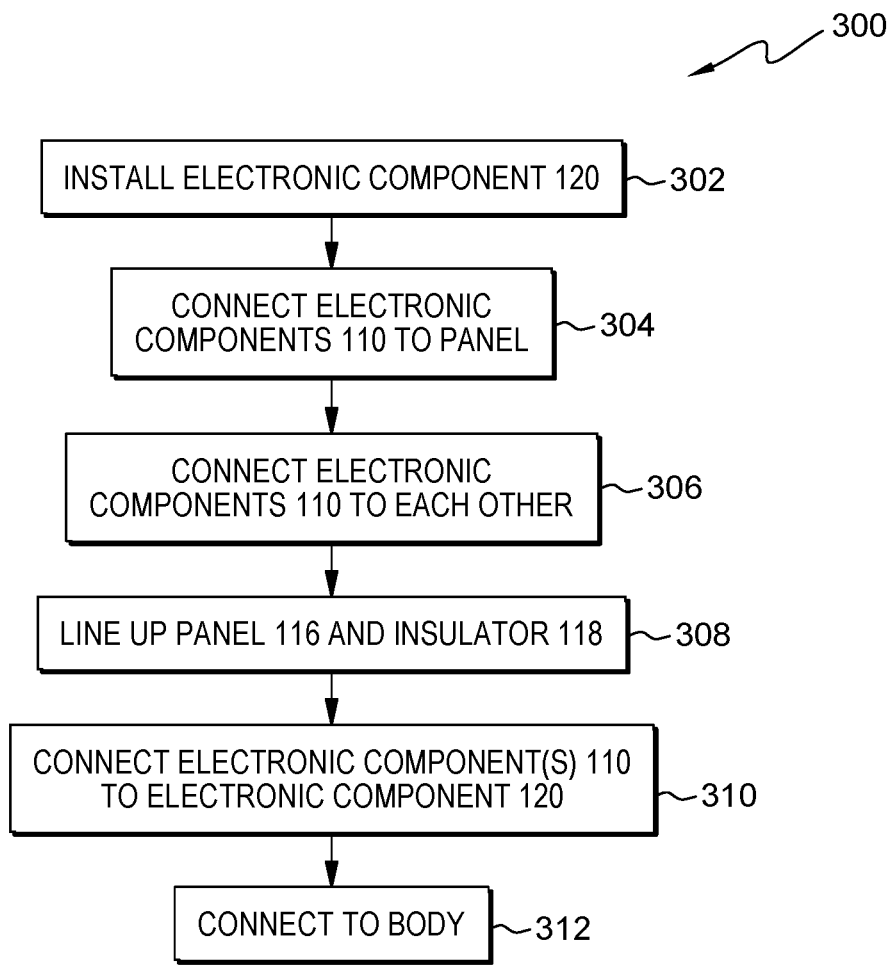
FIG. 6 is an alternative method of assembling the computer system, in accordance with an embodiment of the present disclosure.

FIG. 6 is an alternative method 300 of assembling computer system 100. In the discussion of FIG. 6, the features of FIGS. 1-4 may be included with their respective reference numerals.

In the illustrated embodiment, at operation 302, electronic component 120 is installed in body 114. At operation 304, electronic components 110 are structurally connected to panel 116 at their respective mounting positions 124. At operation 306, electronic components 110 are connected to one another, as appropriate, to form signal chains 106. At operation 308, panel 116 and insulator 118 are lined up over the side of body 114 with opening 130. At operation 310, electronic components 110 are connected to electronic component 120, as appropriate. At operation 312, panel 116 and insulator 118 are connected to body 114 using fasteners 122, thus forming chassis 112.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electronic component system comprising:
a chassis comprising:
a body comprised of a first electrically conductive material;
an electrically isolated portion comprised of a second electrically conductive material; and
an insulator disposed between the electrically isolated portion and the body, wherein the insulator is comprised of a first electrically insulating material;
a first electronic component mounted to the electrically isolated portion; and
a second electronic component mounted to the body and electrically connected to the first electronic component.

2. The electronic component system of claim 1, further comprising:
a third electronic component mounted to the electrically isolated portion and electrically connected to the first electronic component.

3. The electronic component system of claim 2, wherein the third electronic component is not electrically connected to the second electronic component.

4. The electronic component system of claim 1, wherein the first electronic component is included in a hardware signal chain for a quantum computer.

5. The electronic component system of claim 1, wherein the first electronic component is selected from the group consisting of: an amplifier, an attenuator, a directional coupler, a filter, and a splitter.

6. The electronic component system of claim 1, wherein the first electrically insulating material is comprised of polypropylene or silicone.

7. The electronic component system of claim 1, wherein the electrically isolated portion comprises a plurality of mounting features for mounting a plurality of electronic components.

8. The electronic component system of claim 1, wherein the electrically isolated portion is a flat sheet that covers at least 75% of an area of a side of the chassis.

9. The electronic component system of claim 1, wherein the insulator is a flat sheet comprising an outer rim with a plurality of cross members extending across the rim at different locations.

10. The electronic component system of claim 1, wherein the electrically isolated portion and the insulator are connected to the body using a plurality of insulating fasteners, wherein the plurality of insulating fasteners is comprised of a second electrically insulating material.

11. A computer system comprising:
a first computer comprising qubit hardware;
a second computer communicatively connected to the first computer via a plurality of hardware signal chains, wherein the second computer comprises binary hardware, and wherein the binary hardware is for controlling the qubit hardware;
a first electronic component disposed in one of the plurality of hardware signal chains; and
a chassis comprising:
a housing that includes an electrically isolated portion; and
a second electronic component electrically connected to the first electronic component;
wherein the first electronic component is mounted to the electrically isolated portion.

12. The computer system of claim 11, further comprising:
a third electronic component mounted to the electrically isolated portion and electrically connected to the first electronic component by being disposed in the one of the plurality of hardware signal chains.

13. The computer system of claim 12, wherein the third electronic component is not electrically connected to the second electronic component.

14. The computer system of claim 11, wherein the first electronic component is selected from the group consisting of: an amplifier, an attenuator, a directional coupler, a filter, and a splitter.

15. The computer system of claim 11, wherein each of the plurality of hardware signal chains comprises signal cables comprised of a metallic material.

16. The computer system of claim 11, wherein the second electronic component comprises a power supply for the first electronic component.

17. The computer system of claim 11, wherein the second electronic component comprises a monitoring circuit configured to monitor the one of the plurality of hardware signal chains.

18. The computer system of claim 11, further comprising:
a fourth electronic component disposed in another of the plurality of hardware signal chains; and
a fifth electronic component mounted to the housing and electrically connected to the fourth electronic component.

19. An electronic component system comprising:
a chassis comprising:
a body;
an electrically isolated portion comprising at least one mounting feature for mounting a first electronic component; and
an insulator disposed between the electrically isolated portion and the body, wherein the insulator is comprised of a first electrically insulating material;
the first electronic component mounted to the electrically isolated portion; and
a second electronic component mounted to the body and electrically connected to the first electronic component.

* * * * *